(12) United States Patent
    Liu

(10) Patent No.: US 12,300,513 B2
(45) Date of Patent: May 13, 2025

(54) METHOD AND APPARATUS OF CONTROLLING SEMICONDUCTOR MANUFACTURING DEVICE, STORAGE MEDIUM AND SEMICONDUCTOR MANUFACTURING DEVICE

(71) Applicant: CHANGXIN MEMORY TECHNOLOGIES, INC., Hefei (CN)

(72) Inventor: Tzu-Hsuan Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 706 days.

(21) Appl. No.: 17/652,945

(22) Filed: Mar. 1, 2022

(65) Prior Publication Data

US 2023/0053815 A1    Feb. 23, 2023

Related U.S. Application Data

(63) Continuation of application No. PCT/CN2021/116896, filed on Sep. 7, 2021.

(30) Foreign Application Priority Data

Aug. 23, 2021 (CN) .......................... 202110966406.5

(51) Int. Cl.
    *H01L 21/67*    (2006.01)
    *G05B 19/4099*  (2006.01)

(52) U.S. Cl.
    CPC .... *H01L 21/67017* (2013.01); *G05B 19/4099* (2013.01); *G05B 2219/45031* (2013.01)

(58) Field of Classification Search
    CPC ........ H01L 21/67017; H01L 21/67253; G05B 19/4099; G05B 2219/45031
    See application file for complete search history.

(56) References Cited

U.S. PATENT DOCUMENTS

2003/0094134 A1* 5/2003 Minami .............. C23C 16/4407
                                                    427/248.1
2008/0047578 A1* 2/2008 Yoo ........................ B08B 9/027
                                                    134/1.1
(Continued)

FOREIGN PATENT DOCUMENTS

CN         102468206 A     5/2012
CN         102374381 B     9/2013
(Continued)

OTHER PUBLICATIONS

Jin Ho Bae, Gas exhausting equipment operating method for cleaning exhaust pipe of semiconductor production facility (machine translation of KR20200134578), Dec. 2, 2020, ip.com machine translation (Year: 2020).*

(Continued)

*Primary Examiner* — Christopher W Carter
(74) *Attorney, Agent, or Firm* — Syncoda LLC; Feng Ma

(57) ABSTRACT

The present disclosure provides a method and an apparatus of controlling a semiconductor manufacturing device, a medium and a semiconductor manufacturing device. The method of controlling a semiconductor manufacturing device includes: receiving a control instruction, and cutting off or turning on a first airflow path; and when the first airflow path is cut off based on the control instruction, driving an air pumping terminal of an air pumping pipe to be connected to an air outlet terminal of an air intake pipe, and turning on a negative pressure generating device and pumping air from the air intake pipe; or when the first airflow path is turned on based on the control instruction, driving the air pumping terminal to be disconnected from the air outlet terminal of the air intake pipe, and turning off the negative pressure generating device and stopping pumping.

15 Claims, 7 Drawing Sheets

(56) References Cited

U.S. PATENT DOCUMENTS

2018/0068873 A1    3/2018  Minamida et al.
2020/0407845 A1*  12/2020  Miyashita ......... H01L 21/02126

FOREIGN PATENT DOCUMENTS

| CN | 106816398 A | 6/2017 |
| CN | 206363989 U | 7/2017 |
| CN | 207599340 U | 7/2018 |
| CN | 208985967 U | 6/2019 |
| CN | 213207281 U | 5/2021 |

OTHER PUBLICATIONS

Kyu Hwan Ham, Gas exhaust apparatus of semiconductor manufacturing equipment (machine translation of KR20060028008), Mar. 29, 2006, ip.com machine translation (Year: 2006).*
International Search Report cited in PCT/CN2021/116896 mailed May 19, 2022, 10 pages.

* cited by examiner

METHOD AND APPARATUS OF CONTROLLING SEMICONDUCTOR MANUFACTURING DEVICE, STORAGE MEDIUM AND SEMICONDUCTOR MANUFACTURING DEVICE

CROSS-REFERENCE TO RELATED APPLICATIONS

This is a continuation of International Application No. PCT/CN2021/116896, filed on Sep. 7, 2021, which claims the priority to Chinese Patent Application 202110966406.5, titled "METHOD, DEVICE, AND SYSTEM OF CONTROLLING SEMICONDUCTOR MANUFACTURING DEVICE, AND STORAGE MEDIUM" and filed on Aug. 23, 2021. The entire contents of International Application No. PCT/CN2021/116896 and Chinese Patent Application 202110966406.5 are incorporated herein by reference.

TECHNICAL FIELD

The present disclosure relates to, but is not limited to, a method and an apparatus of controlling a semiconductor manufacturing device, a storage medium and a semiconductor manufacturing device.

BACKGROUND

In the semiconductor manufacturing process, chemical vapor deposition (CVD) technology is often used. Chemical vapor deposition is a process in which a variety of gaseous raw materials are fed into a reaction chamber and deposited on the surface of the wafer through a series of chemical reactions, such that the surface of the wafer is covered with a film.

As the reaction time increases, reactant will be deposited on an inner wall of the reaction chamber, and the accumulated deposited reactant may affect the deposition effect on the wafer surface. Moreover, if too much deposited reactant is accumulated and falls onto the wafer surface, defects may be generated on the wafer. Therefore, it is necessary to maintain the reaction chamber regularly.

However, when the reaction chamber is opened, there is a risk of foreign objects falling from the reaction chamber, and the reaction chamber will be exposed to the atmosphere. Consequently, the deposited reactant will react chemically with the atmospheric gas molecules and unintended synthetics are produced.

SUMMARY

An overview of the subject matter detailed in the present disclosure is provided below, which is not intended to limit the protection scope of the claims.

Embodiments of the present disclosure provide a method and an apparatus of controlling a semiconductor manufacturing device, a storage medium and a semiconductor manufacturing device.

According to a first aspect, an embodiment of the present disclosure provides a method of controlling a semiconductor manufacturing device, the semiconductor manufacturing device including an air intake pipe and an air jet pipe, the air intake pipe and the air jet pipe being configured to be connected and form a first airflow path, and the method of controlling including:

receiving a control instruction, the control instruction being used for instructing to disconnect an air outlet terminal of the air intake pipe from an air inlet terminal of the air jet pipe, to cut off the first airflow path, or connect the air outlet terminal of the air intake pipe to the air inlet terminal of the air jet pipe, to turn on the first airflow path; and driving an air pumping terminal of an air pumping pipe to be connected to the air outlet terminal of the air intake pipe when the control instruction instructs to cut off the first airflow path, such that the air pumping pipe and the air intake pipe are connected and form a second airflow path, and turning on a negative pressure generating device at the air pumping terminal and pumping air from the air intake pipe; or driving the air pumping terminal to be disconnected from the air outlet terminal of the air intake pipe when the control instruction instructs to turn on the first airflow path, to cut off the second airflow path, and turning off the negative pressure generating device and stopping pumping.

According to a second aspect, an embodiment of the present disclosure provides an apparatus of controlling a semiconductor manufacturing device, configured to implement the method of controlling a semiconductor manufacturing device described above, the semiconductor manufacturing device including an air intake pipe and an air jet pipe, the air intake pipe and the air jet pipe being configured to be connected and form a first airflow path, and the apparatus of controlling including:

a processor; and a memory for storing an instruction executable by the processor;

wherein the processor is configured to perform:

receiving a control instruction, the control instruction being used for instructing to disconnect an air outlet terminal of the air intake pipe from an air inlet terminal of the air jet pipe, to cut off the first airflow path, or connect the air outlet terminal of the air intake pipe to the air inlet terminal of the air jet pipe, to turn on the first airflow path; and turning on a negative pressure generating device and connecting the negative pressure generating device to the air outlet terminal of the air intake pipe or turning off the negative pressure generating device and disconnecting the negative pressure generating device from the air outlet terminal of the air intake pipe based on the control instruction;

wherein the negative pressure generating device comprises an air pumping pipe, and when the first airflow path is cut off, the negative pressure generating device is turned on and connected to the air outlet terminal of the air intake pipe, such that the air pumping pipe and the air intake pipe are connected and form a second airflow path.

According to a third aspect, an embodiment of the present disclosure provides a semiconductor manufacturing device, including:

a device portion;

an air intake pipe, the air intake pipe being disposed in the device portion;

an air jet pipe, the air jet pipe being disposed in the device portion, the air intake pipe and the air jet pipe being configured to be connected and form a first airflow path;

a negative pressure generating device, the negative pressure generating device being detachably connected to the device portion;

an air pumping pipe, an air pumping terminal of the air pumping pipe being connected to the negative pressure generating device, and when the first airflow path is cut off, the negative pressure generating device is connected to an air outlet terminal of the air intake pipe through the air pumping pipe, such that the air pumping pipe and the air intake pipe are connected and form a second airflow path; and a device control portion, the device control portion being electrically connected to the negative pressure generating device.

According to a fourth aspect, an embodiment of the present disclosure provides a non-transitory computer-readable storage medium, when an instruction in the storage medium is executed by a processor of an apparatus of controlling a semiconductor manufacturing device, the apparatus of controlling a semiconductor manufacturing device is caused to perform:

receiving a control instruction, the control instruction being used for instructing to disconnect an air outlet terminal of an air intake pipe from an air inlet terminal of an air jet pipe, to cut off a first airflow path, or connect the air outlet terminal of the air intake pipe to the air inlet terminal of the air jet pipe, to turn on the first airflow path; and driving a negative pressure generating device to be turned on and connected to the air outlet terminal of the air intake pipe or driving the negative pressure generating device to be turned off and disconnected from the air outlet terminal of the air intake pipe based on the control instruction;

wherein the negative pressure generating device comprises an air pumping pipe, and when the first airflow path is cut off, the negative pressure generating device is turned on and connected to the air outlet terminal of the air intake pipe, such that the air pumping pipe and the air intake pipe are connected and form a second airflow path.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

Figure 1:
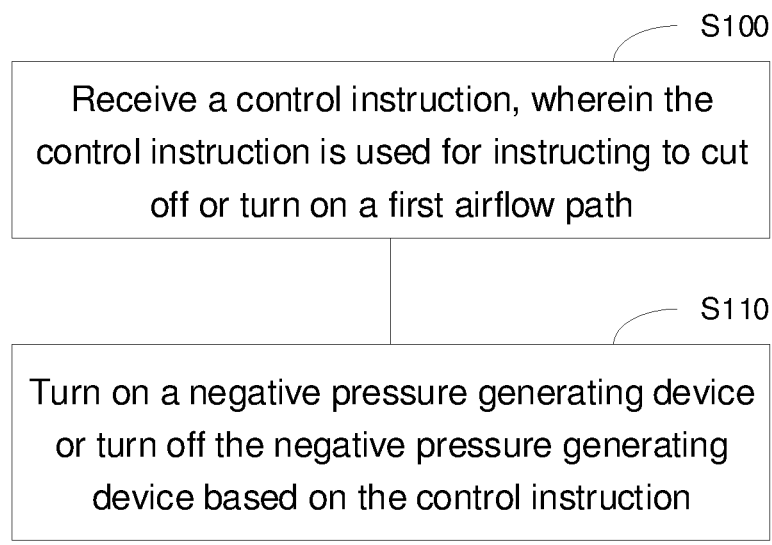
FIG. 1 is a flowchart of a method of controlling a semiconductor manufacturing device according to an exemplary embodiment.

REFERENCE NUMERALS 1. device portion; 11. carrier body; 111. carrying space; 12. cover body; 13. sealing structure; 131. first sealing portion; 132. second sealing portion;

2. air intake pipe; 21. adjusting portion; 3. air jet pipe; 4. negative pressure generating device; 41. device body; 411. accommodating space; 412. connection pipe;

42. driving portion; 43. negative pressure control portion; 44. detection portion; 441. detector; 442. display; 45. balancing portion;

5. air pumping pipe; 6. semiconductor; 7. support; 8. dust collection box;

9. apparatus of controlling a semiconductor manufacturing device; 91. processor; 92. memory.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

An exemplary embodiment of the present disclosure provides a method of controlling a semiconductor manufacturing device, as shown in FIG. 1 to FIG. 4. FIG. 1 to FIG. 4 are flowcharts of a method of controlling a semiconductor manufacturing device according to an exemplary embodiment of the present disclosure. The following describes the method of controlling a semiconductor manufacturing device with reference to FIG. 1 to FIG. 4.

An exemplary embodiment of the present disclosure provides a method of controlling a semiconductor manufacturing device. The method of controlling a semiconductor manufacturing device in this embodiment is applied to a semiconductor manufacturing device, where the semiconductor manufacturing device includes an air intake pipe and an air jet pipe, and the air intake pipe and the air jet pipe are configured to be connected and form a first airflow path. The semiconductor manufacturing device further includes a device control portion, a driving portion, and a negative pressure generating device. The device control portion can control the driving portion and the negative pressure generating device.

As shown in FIG. 1, the method of controlling a semiconductor manufacturing device includes the following steps:

Step S100: Receive a control instruction, where the control instruction is used for instructing to disconnect an air outlet terminal of the air intake pipe from an air inlet terminal of the air jet pipe, to cut off the first airflow path, or connect the air outlet terminal of the air intake pipe to the air inlet terminal of the air jet pipe, to turn on the first airflow path.

In this step, the device control portion of the semiconductor manufacturing device receives a control instruction for the semiconductor manufacturing device.

For example, the control instruction is an instruction for disconnecting the air outlet terminal of the air intake pipe from the air inlet terminal of the air jet pipe, to cut off the first airflow path, thus blocking the path of gaseous raw materials.

For example, the control instruction may also be an instruction for connecting the air outlet terminal of the air intake pipe to the air inlet terminal of the air jet pipe, to turn on the first airflow path, thus turning on the path of the gaseous raw materials, so as to continue with the reaction of the chemical vapor deposition.

A method for triggering the control instruction may be a touch control method. The semiconductor manufacturing device is provided with, for example, a physical key. When the first airflow path of the semiconductor manufacturing device needs to be cut off or turned on, the physical key of the semiconductor manufacturing device is pressed to trigger a control signal; the device control portion of the semiconductor manufacturing device receives the control signal, and a corresponding control instruction is obtained by analyzing the control signal.

Alternatively, the method for triggering the control instruction may be, for example, a method based on audio information. When the semiconductor manufacturing device receives particular audio information and transmits the audio information to the device control portion of the semiconductor manufacturing device, the device control portion analyzes the audio information to determine the corresponding control instruction. The audio information may be, for example, "cut off the first airflow path", "turn on the first airflow path" and other information with indicative content.

Certainly, it may be understood that, the method for triggering the control instruction is not limited to the methods listed above, and the foregoing methods are merely used for illustrating this embodiment. The method for triggering the control instruction may also be, for example, a method based on virtual keys. Multiple virtual keys are built in a display screen with an interaction interface, and by tapping on a corresponding virtual key, a corresponding control instruction is triggered, thus selecting a function of the semiconductor manufacturing device.

It should be further noted that, an execution range of the audio information is also an example for description, and does not limit the present disclosure. The audio information may also be used for calling a corresponding function option through voice information recognition, and a corresponding selected function can be determined according to voice information.

Step S110: When the control instruction instructs to cut off the first airflow path, drive an air pumping terminal of an air pumping pipe to be connected to the air outlet terminal of the air intake pipe, such that the air pumping pipe and the air intake pipe are connected and form a second airflow path, and turn on a negative pressure generating device at the air pumping terminal and pumping air from the air intake pipe; alternatively, when the control instruction instructs to turn on the first airflow path, drive the air pumping terminal to be disconnected from the air outlet terminal of the air intake pipe, to cut off the second airflow path, and turn off the negative pressure generating device and stopping pumping.

In step S100, the device control portion of the semiconductor manufacturing device receives and analyzes the control instruction, and controls the semiconductor manufacturing device to execute the control instruction.

When the instruction received by the device control portion of the semiconductor manufacturing device instructs to cut off the first airflow path, the driving portion is controlled to drive the air pumping terminal of the air pumping pipe to be connected to the air outlet terminal of the air intake pipe, such that the air pumping pipe and the air intake pipe are connected to form the second airflow path, and the negative pressure generating device at the air pumping terminal is turned on and pumping air from the air intake pipe, to remove residual gaseous raw materials in the air intake pipe, thereby further reducing the risk of reaction between the residual gaseous raw materials and gas in the atmosphere.

When the instruction received by the device control portion of the semiconductor manufacturing device instructs to turn on the first airflow path, the driving portion is controlled to drive the air pumping terminal to be disconnected from the air outlet terminal of the air intake pipe, to cut off the second airflow path, and the negative pressure generating device is turned off and stopping pumping.

According to the method of controlling in this embodiment, a control instruction is executed to implement on/off of the first airflow path, thus implementing automation of the semiconductor manufacturing device. By controlling the connection between the air pumping pipe and the air outlet terminal of the air intake pipe, water molecules and gas molecules in the atmosphere are effectively blocked to avoid the reaction between the deposited reactant inside the air intake pipe and the molecules in the atmosphere, thus avoiding producing unintended synthetics. At the same time, the negative pressure generating device is controlled to pump out the residual gaseous raw materials and particulate dust from the air intake pipe to prevent foreign matter from falling into the air intake pipe to affect the cleanliness of the air intake pipe.

An exemplary embodiment of the present disclosure provides a method of controlling a semiconductor manufacturing device. The method of controlling a semiconductor manufacturing device in this embodiment is applied to a semiconductor manufacturing device, where the semiconductor manufacturing device includes an air intake pipe and an air jet pipe, and the air intake pipe and the air jet pipe are configured to be connected and form a first airflow path. The semiconductor manufacturing device further includes a device control portion, a driving portion, a detector, and a negative pressure generating device. The device control portion is electrically connected to the driving portion, the detector and the negative pressure generating device respectively, and the device control portion can control the driving portion and the negative pressure generating device.

Figure 2:
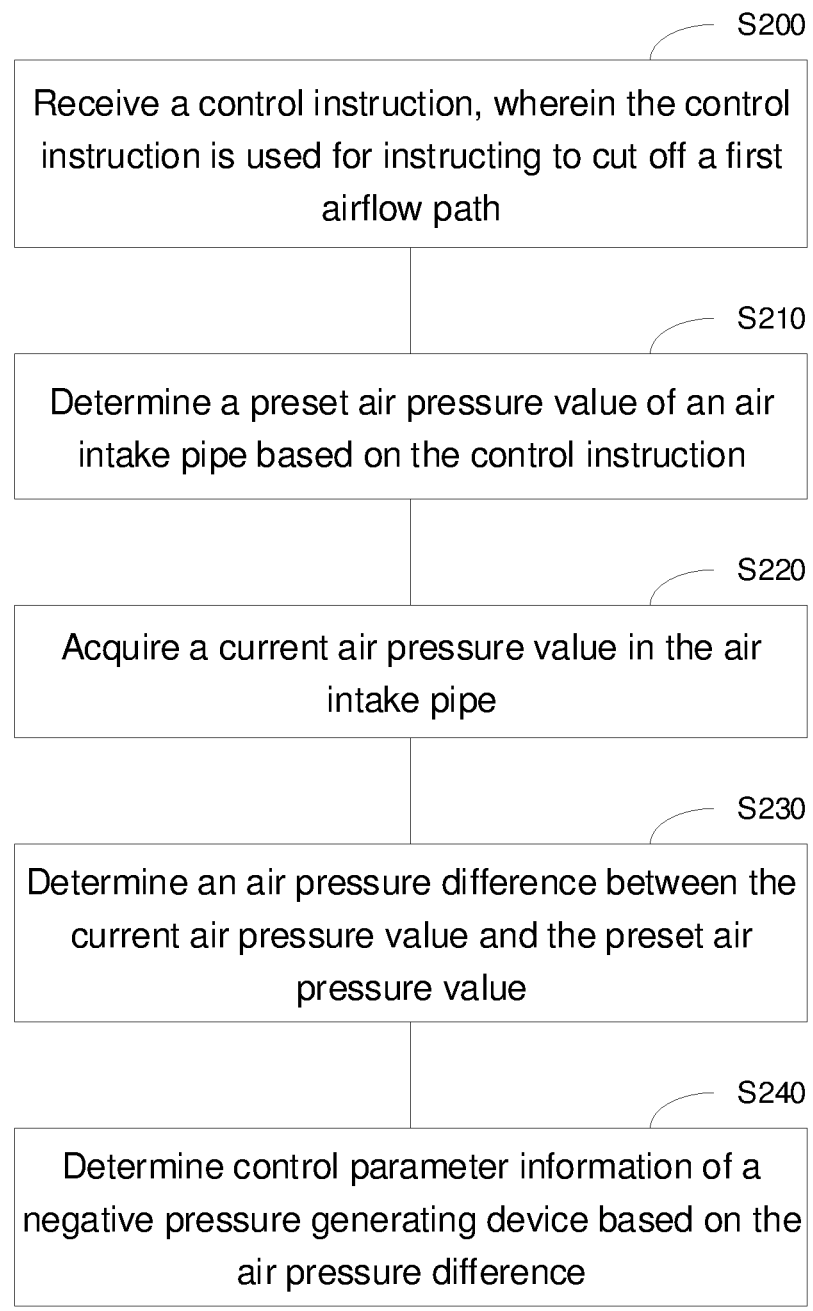
FIG. 2 is a flowchart of a method of controlling a semiconductor manufacturing device according to an exemplary embodiment.

As shown in FIG. 2, the method of controlling a semiconductor manufacturing device includes the following steps:

Step S200: Receive a control instruction, where the control instruction is used for instructing to disconnect an air outlet terminal of the air intake pipe from an air inlet terminal of the air jet pipe, to cut off the first airflow path.

The implementation of step S200 is the same as the implementation of step S100 in the foregoing embodiment, and details are not described herein again.

Step S210: When an air pumping terminal of an air pumping pipe is driven to be connect to the air outlet terminal of the air intake pipe based on the control instruction, determine a preset air pressure value of the air intake pipe.

In this step, the device control portion of the semiconductor manufacturing device receives the control instruction, and drives the air pumping terminal of the air pumping pipe to be connected to the air outlet terminal of the air intake pipe, to isolate the air intake pipe from the external environment. The device control portion of the semiconductor manufacturing device determines the preset air pressure value of the air intake pipe.

The preset air pressure value may be a target air pressure value pre-stored in the semiconductor manufacturing device, which is recorded in the semiconductor manufacturing device in advance, to be retrieved by the device control portion at any time, thus realizing an automated mode of the semiconductor manufacturing device.

Alternatively, the preset air pressure value may be a target air pressure value inputted to the semiconductor manufacturing device in real time, to be adjusted in real time as required, such that the interior of the air intake pipe is in an optimal air pressure state and meets the air pressure requirement, thus improving the practicability of the semiconductor manufacturing device.

For example, the preset air pressure value may be a specific value, such as 5 torr, or the preset air pressure value may be a value interval, such as 1 torr to 5 torr.

Step S220: Acquire a current air pressure value in the air intake pipe.

In this step, a detector of the semiconductor manufacturing device detects the current air pressure value in the air intake pipe, and the device control portion of the semiconductor manufacturing device acquires the detection result.

For example, the detector may be a sensor, and the sensor detects and monitors the air pressure value in the air intake pipe in real time.

Step S230: Determine an air pressure difference according to the current air pressure value and the preset air pressure value.

In step S220, the device control portion of the semiconductor manufacturing device performs calculation and analysis according to the current air pressure value in the air intake pipe and the preset air pressure value of the air intake pipe, to determine the air pressure difference between the two.

Step S240: Determine control parameter information of the negative pressure generating device based on the air pressure difference.

In step S240, the device control portion of the semiconductor manufacturing device determines the control parameter information of the negative pressure generating device based on the air pressure difference.

When the negative pressure generating device pumps air from the air intake pipe, the air pressure in the air pumping pipe will change in real time. The device control portion determines different air pressure differences according to different air pressure values, thereby obtaining the control parameter information of the negative pressure generating device. According to the control parameter information, a corresponding control instruction is sent to the negative pressure generating device, such that the negative pressure generating device adjusts the air pumping state of the air intake pipe at any time.

According to the method in this embodiment, the detector is used to detect the current air pressure value in the air intake pipe in real time, such that the device control portion of the semiconductor manufacturing device determines the air pressure difference between the current air pressure value in the air intake pipe and the preset air pressure value of the air intake pipe, and adjusts the control parameter information of the negative pressure generating device in real time according to the air pressure difference, to prevent the air intake pipe from being damaged by the negative pressure generating device, and improve the safety of the air intake pipe.

An exemplary embodiment of the present disclosure provides a method of controlling a semiconductor manufacturing device. The method of controlling a semiconductor manufacturing device in this embodiment is applied to a semiconductor manufacturing device, where the semiconductor manufacturing device includes an air intake pipe and an air jet pipe, and the air intake pipe and the air jet pipe are configured to be connected and form a first airflow path. The semiconductor manufacturing device further includes a device control portion, a driving portion, a detector, and a negative pressure generating device. The device control portion is electrically connected to the driving portion, the detector and the negative pressure generating device respectively, and the device control portion can control the driving portion and the negative pressure generating device.

As shown in FIG. 2, the method of controlling a semiconductor manufacturing device includes the following steps:

Step S300: Receive a control instruction, where the control instruction is used for instructing to disconnect an air outlet terminal of the air intake pipe from an air inlet terminal of the air jet pipe, to cut off the first airflow path.

Step S310: When an air pumping terminal of an air pumping pipe is driven to be connect to the air outlet terminal of the air intake pipe based on the control instruction, determine a preset air pressure value of the air intake pipe.

Step S320: Acquire a current air pressure value in the air intake pipe.

Step S330: Determine an air pressure difference according to the current air pressure value and the preset air pressure value.

Steps S300 to S330 in this embodiment are implemented in the same manner as step S200 to S230 in the foregoing embodiment, and will not be described in detail again herein.

Step S340: Acquire configuration information.

In this step, the configuration information is used for representing a correspondence between the air pressure difference and an airflow parameter, and the airflow parameter includes an airflow rate and duration of airflow.

The air pressure difference is a difference between the current air pressure value in the air intake pipe and the preset air pressure value of the air intake pipe. A correspondence between the air pressure difference and the airflow parameter of the negative pressure generating device during pumping may be pre-stored in the configuration information.

In an example, the airflow parameter may be an airflow velocity. For example, an air pressure difference less than 10 torr corresponds to low-velocity control parameter information; and an air pressure difference greater than 10 torr corresponds to high-velocity control parameter information.

In another example, the airflow parameter may be an airflow rate. For example, when the air pressure difference is less than 10 torr, the negative pressure generating device carries out pumping with the control parameter information of 0.1 m$^3$/s; when the air pressure difference is greater than 10 torr, the negative pressure generating device carries out pumping with the control parameter information of 1 m³/s.

Step S350: Determine a target airflow parameter based on the air pressure difference and the configuration information.

In this step, the device control portion of the semiconductor manufacturing device receives the current air pressure value in the air intake pipe, and finally determines the air pressure difference between the current air pressure value and the preset air pressure value. By searching or traversing, control parameter information corresponding to the current air pressure difference can be found in the configuration information.

In an example, different fixed pumping rate values may be set in the configuration information, including all integers from 0 to 100, and each fixed pumping rate value corresponds to one piece of control parameter information. For example, when the pumping rate value is 0, it corresponds to the air pressure difference of 0 torr; and when the pumping rate value is 100, it corresponds to the air pressure difference of 100 torr.

Certainly, it should be noted that, the setting about the parameter is merely an example for description, and does not limit the present disclosure.

According to the method in this embodiment, the configuration information is set in advance, and the device control portion of the semiconductor manufacturing device can quickly adjust the pumping state according to the air pressure difference and the configuration information, thereby improving the control efficiency of the negative pressure generating device.

An exemplary embodiment of the present disclosure provides a method of controlling a semiconductor manufacturing device. The method of controlling a semiconductor manufacturing device in this embodiment is applied to a semiconductor manufacturing device, where the semiconductor manufacturing device includes an air intake pipe and an air jet pipe, and the air intake pipe and the air jet pipe are configured to be connected and form a first airflow path. The semiconductor manufacturing device further includes a device control portion, a driving portion, a detection portion, and a negative pressure generating device. The device control portion can control the driving portion and the negative pressure generating device, the detection portion is disposed in the negative pressure generating device, and the detection portion includes a detector and a display.

Figure 4:
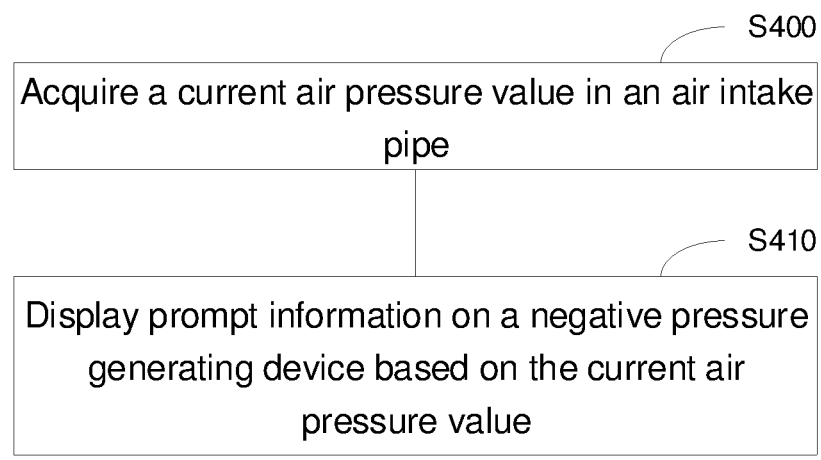
FIG. 4 is a flowchart of a method of controlling a semiconductor manufacturing device according to an exemplary embodiment.

As shown in FIG. 4, the method of controlling a semiconductor manufacturing device includes the following steps:

S400: Acquire a current air pressure value in the air intake pipe.

In this step, the detector detects the current air pressure value in the air intake pipe, and the device control portion of the semiconductor manufacturing device acquires the detection result.

For example, the detector may be a sensor, and the sensor detects and monitors the air pressure value in the air intake pipe in real time.

S410: Display prompt information on the negative pressure generating device based on the current air pressure value.

In this step, when acquiring the current air pressure value in the air intake pipe, the device control portion of the semiconductor manufacturing device sends the current air pressure value to the display, and the display displays the prompt information. For example, the display may be an indicator light.

If the current air pressure value falls within a first preset interval, first prompt information is displayed. For example, the first prompt information may be displaying a green indicator light, to represent that the air pressure difference in the air intake pipe has not reached a target air pressure difference, and the negative pressure generating device maintains the pumping state.

If the current air pressure value falls within a second preset interval, second prompt information is displayed. For example, the second prompt information may be displaying a red indicator light, to represent that the air pressure difference in the air intake pipe has reached the target air pressure difference, and the negative pressure generating device ends the pumping state.

The negative pressure generating device may end the pumping state manually or automatically. In addition to using the color as an alarming state, the display can also use audio information as an auxiliary to the color, to make sure that the operating personnel notices the alarming effect.

According to the method in this embodiment, the prompt information is used as an alarm to improve the safety of the gas generator, ensure that residual gas in the air intake pipe can be removed, and avoid that the gas generator keeps pumping to cause an excessively high negative pressure in the air pumping pipe which affects the service life of the air pumping pipe.

The present disclosure further provides an apparatus of controlling a semiconductor manufacturing device, configured to implement the method of controlling a semiconductor manufacturing device as described in the foregoing embodiment. The semiconductor manufacturing device includes an air intake pipe and an air jet pipe, where the air intake pipe and the air jet pipe are configured to be connected and form a first airflow path.

Figure 5:
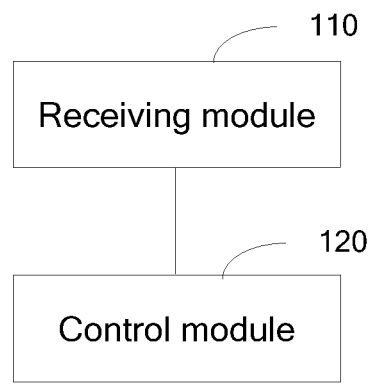
FIG. 5 is a block diagram of an apparatus of controlling a semiconductor manufacturing device according to an exemplary embodiment.

An exemplary embodiment of the present disclosure provides an apparatus of controlling a semiconductor manufacturing device, as shown in FIG. 5. FIG. 5 shows a block diagram of an apparatus of controlling a semiconductor manufacturing device according to an exemplary embodiment of the present disclosure. The apparatus of controlling a semiconductor manufacturing device is described below with reference to FIG. 5.

In an exemplary embodiment, as shown in FIG. 5, the apparatus of controlling in this embodiment includes: a receiving module 110 and a control module 120, and is configured to implement the method shown in FIG. 1.

In the implementation process, the receiving module 110 is configured to receive a control instruction, where the control instruction is used for instructing to disconnect an air outlet terminal of the air intake pipe from an air inlet terminal of the air jet pipe, to cut off the first airflow path, or connect the air outlet terminal of the air intake pipe to the air inlet terminal of the air jet pipe to turn on the first airflow path. The control module 120 is configured to turn on a negative pressure generating device and connect the negative pressure generating device to the air outlet terminal of the air intake pipe or turn off the negative pressure generating device and disconnect the negative pressure generating device from the air outlet terminal of the air intake pipe based on the control instruction. The negative pressure generating device includes an air pumping pipe, and when the first airflow path is cut off, the negative pressure generating device is turned on and connected to the air outlet terminal of the air intake pipe, such that the air pumping pipe and the air intake pipe are connected and form a second airflow path.

In an exemplary embodiment, as shown in FIG. 5, the apparatus of controlling in this embodiment includes: a receiving module 110 and a control module 120, and is configured to implement the method shown in FIG. 2.

In the implementation process, the control module 120 is configured to determine a preset air pressure value of the air intake pipe, acquire a current air pressure value in the air intake pipe, determine an air pressure difference according to the current air pressure value and the preset air pressure value, and determine control parameter information of the negative pressure generating device based on the air pressure difference.

Figure 3:
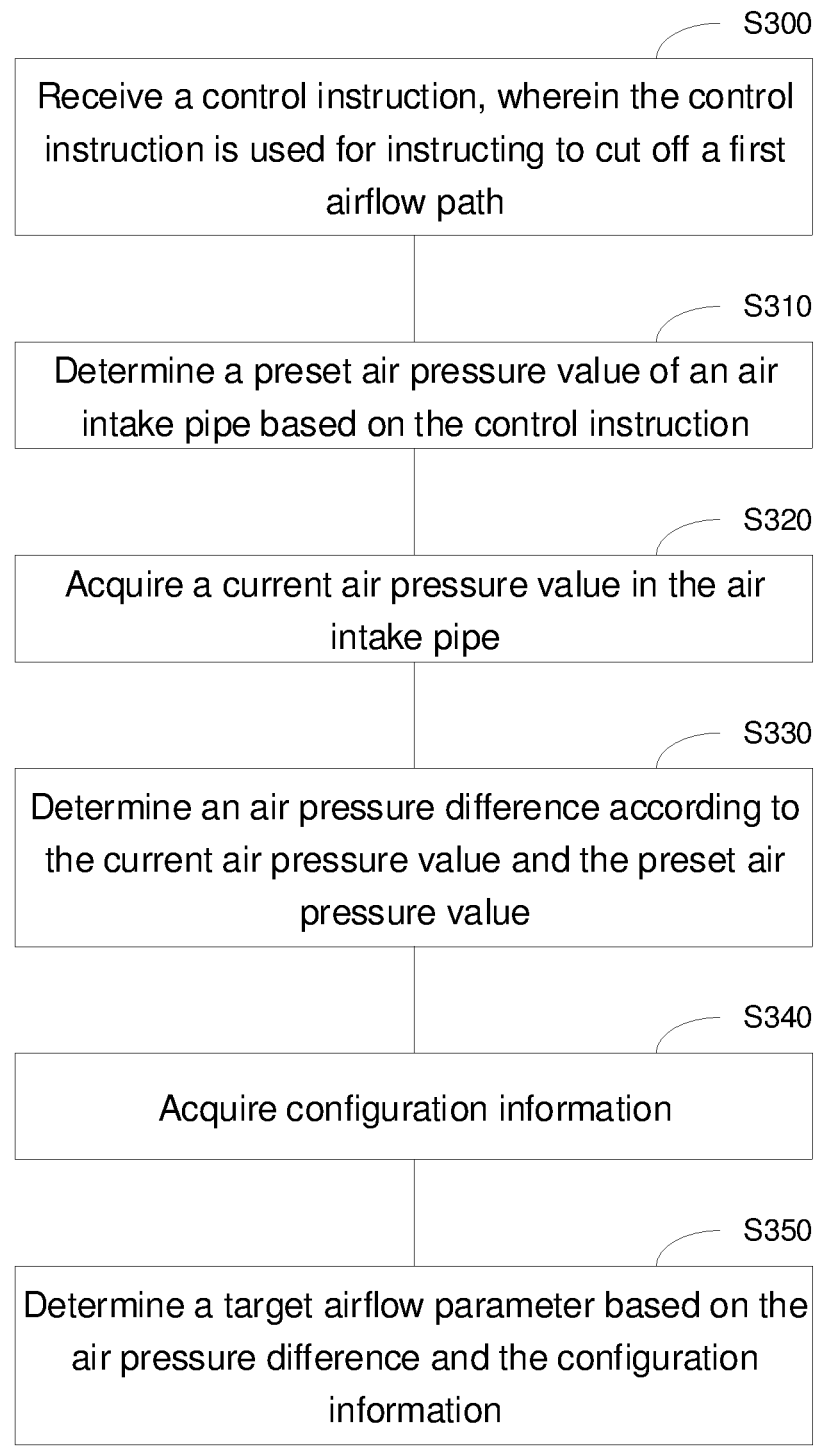
FIG. 3 is a flowchart of a method of controlling a semiconductor manufacturing device according to an exemplary embodiment.

In an exemplary embodiment, as shown in FIG. 5, the apparatus of controlling in this embodiment includes: a receiving module 110 and a control module 120, and is configured to implement the method shown in FIG. 3.

In the implementation process, the control module 120 is configured to acquire configuration information, where the configuration information is used for representing a correspondence between the air pressure difference and an airflow parameter, and the airflow parameter includes an airflow rate and duration of airflow; and determine a target airflow parameter based on the air pressure difference and the configuration information.

In an exemplary embodiment, as shown in FIG. 5, the apparatus of controlling in this embodiment includes: a receiving module 110 and a control module 120, and is configured to implement the method shown in FIG. 4.

In the implementation process, the control module 120 is configured to acquire a current air pressure value in the air intake pipe, and display prompt information on the negative pressure generating device based on the current air pressure value.

The present disclosure further provides a semiconductor manufacturing device, including a device portion, an air intake pipe, an air jet pipe, a negative pressure generating device, an air pumping pipe, and a device control portion. The air intake pipe is disposed in the device portion; the air jet pipe is disposed in the device portion; the air intake pipe and the air jet pipe are configured to be connected and form a first airflow path. The negative pressure generating device and the device portion are detachably connected, and an air pumping terminal of the air pumping pipe is connected to the negative pressure generating device. When the first airflow path is cut off, the negative pressure generating device is connected to an air outlet terminal of the air intake pipe through the air pumping pipe, such that the air pumping pipe and the air intake pipe are connected and form a second airflow path. The device control portion is electrically connected to the negative pressure generating device. The negative pressure generating device in the present disclosure is connected to the air outlet terminal of the air intake pipe through the air pumping pipe, which prevents the air intake pipe from being exposed to the atmosphere and effectively blocks water molecules and gas molecules in the atmosphere, to avoid the reaction between the deposited reactant inside the air intake pipe and the molecules in the atmosphere, thus avoiding producing unintended synthetics. Moreover, the negative pressure generating device pumps out the residual gaseous raw materials and particulate dust from the air intake pipe to prevent foreign matter from falling into the air intake pipe to affect the cleanliness of the air intake pipe.

Figure 6:
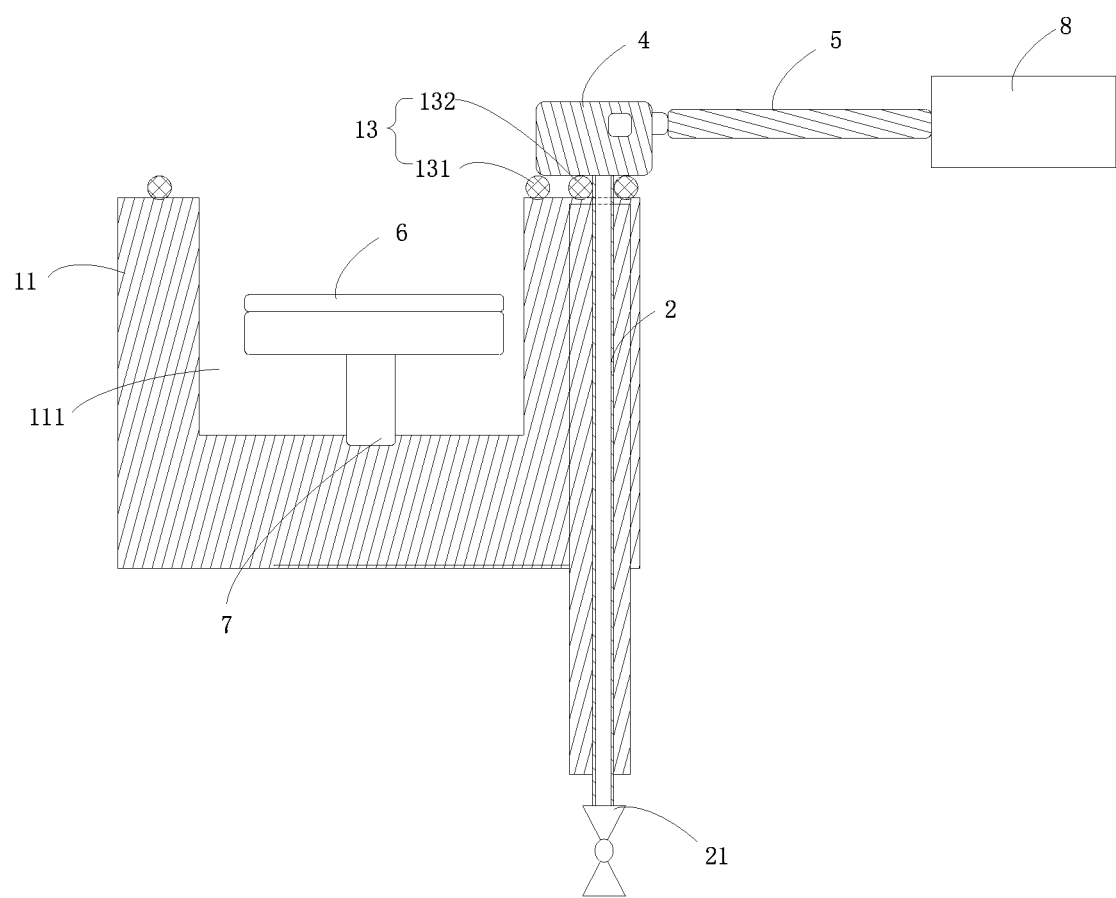
FIG. 6 is a schematic structural diagram of a semiconductor manufacturing device according to an exemplary embodiment.
Figure 7:
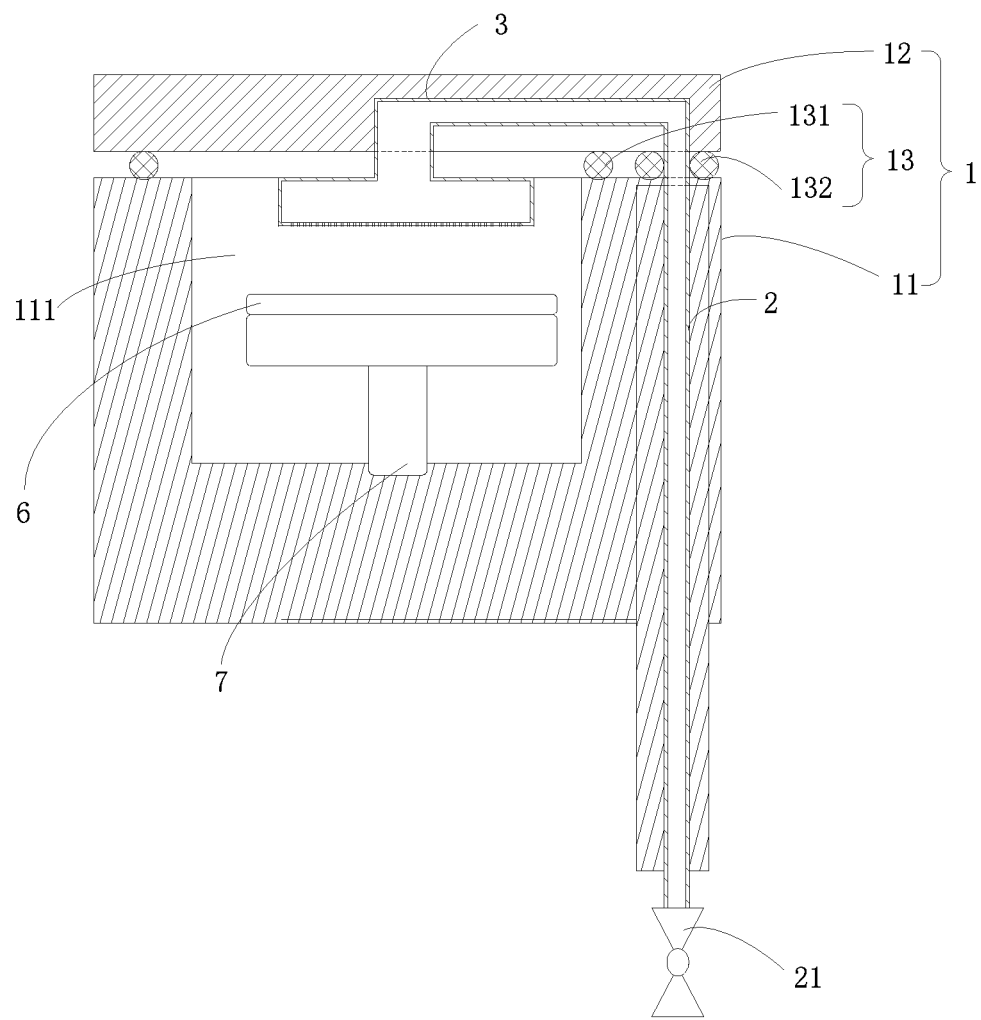
FIG. 7 is a schematic structural diagram of a device portion of a semiconductor manufacturing device according to an exemplary embodiment.
Figure 8:
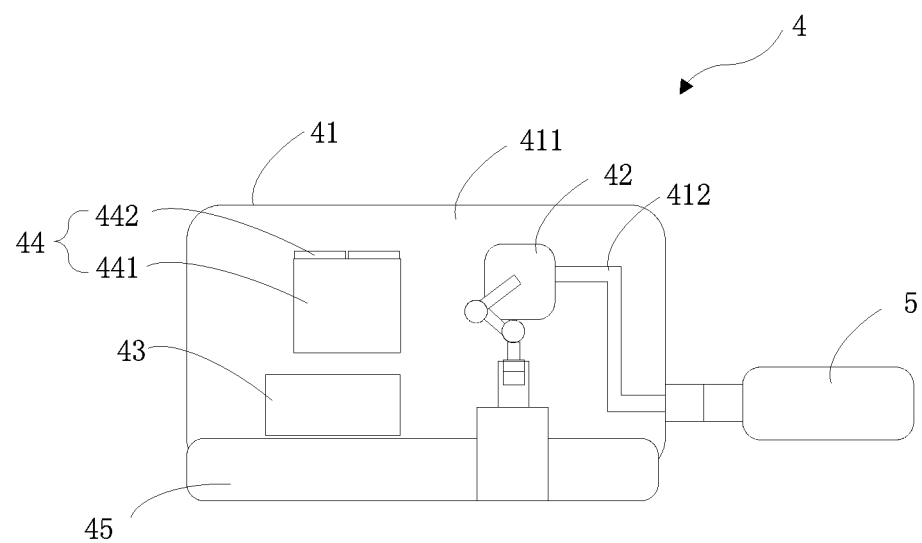
FIG. 8 is a schematic structural diagram of a negative pressure generating device of a semiconductor manufacturing device according to an exemplary embodiment.

An exemplary embodiment of the present disclosure provides a semiconductor manufacturing device, as shown in FIG. 6 to FIG. 8. FIG. 6 to FIG. 8 are schematic structural diagrams of a semiconductor manufacturing device according to an exemplary embodiment of the present disclosure. The following describes the semiconductor manufacturing device with reference to FIG. 6 to FIG. 8.

In an exemplary embodiment, as shown in FIG. 6 and FIG. 7, a semiconductor manufacturing device includes a device portion 1, an air intake pipe 2, an air jet pipe 3, a negative pressure generating device 4, an air pumping pipe 5, and a device control portion. The device control portion (not shown in the figure) may be disposed on the remote console, to make it convenient for the operating personnel to work on the device control portion to manipulate the semiconductor manufacturing device. For example, the device control portion may be disposed on the machine of the remote console. The machine of the remote console is provided with a physical button, and a control instruction is sent to the device control portion by using the physical button. The machine of the remote console may further be provided with, for example, a display screen. A virtual button is displayed on the display screen, and a control instruction is sent to the device control portion by using the virtual button. The device control portion controls the negative pressure generating device 4 to move based on the control instruction.

In this embodiment, as shown in FIG. 6 and FIG. 7, the air intake pipe 2 is disposed on the device portion 1, and an air inlet terminal of the air intake pipe 2 extends out of the device portion 1, such that the air inlet terminal of the air intake pipe 2 is connected to an external airflow delivery apparatus (not shown in the figure), to allow the external airflow delivery apparatus to input gaseous raw materials to the device portion 1 through the air intake pipe 2. For example, the gaseous raw materials may be, but are not limited to, ethyl orthosilicate (TEOS), and tetradimethylaminotitanium (TDMAT). The gaseous raw materials are chemically reacted to form a film layer, which can be deposited, for example, on the surface of a semiconductor 6. The semiconductor manufacturing device further includes an adjusting portion 21, which may be, for example, a regulating valve. The adjusting portion 21 is disposed on a side of the air intake pipe 2 away from the negative pressure generating device 4, i.e., between the external airflow delivery apparatus and the air intake pipe 2. The adjusting portion 21 can control the flow velocity of the gaseous raw materials passing through the air intake pipe 2, and when the air intake pipe 2 is in an off-state, the adjusting portion 21 can close the air inlet terminal of the air intake pipe 2, to prevent the gaseous raw materials from continuing to enter the air intake pipe 2.

The air outlet terminal of the air intake pipe 2 is connected to the air jet pipe 3 to form a first airflow path. The air jet pipe 3 is disposed in the device portion 1, and the first airflow path penetrates the device portion 1, to ensure smooth delivery of the gaseous raw materials.

The negative pressure generating device 4 and the device portion 1 are detachably connected, the device control portion is electrically connected to the negative pressure generating device 4, so as to control the negative pressure generating device 4.

When the device portion 1 needs to be maintained to clean the deposited reactant produced by the gaseous raw materials, the device control portion controls the negative pressure generating device 4 to move to the device portion 1 and be connected to the device portion 1, to cut off the first airflow path; the negative pressure generating device 4 is connected to the air pumping terminal of the air pumping pipe 5, to help apply negative air pressure to the interior of the air pumping pipe 5, and pump out the gaseous raw materials and particulate foreign matter from the air intake pipe 2.

The air intake pipe 2 and the air pumping pipe 5 are connected and form a second airflow path, and the negative pressure generating device 4 is connected to the second airflow path, to ensure that the gaseous raw materials and particulate foreign matter in the air intake pipe 2 can be discharged to the external. The gaseous raw materials and the particulate foreign matter may be directly discharged to the atmosphere, which is convenient. Alternatively, the gaseous raw materials and the particulate foreign matter may be collected in a dust collection box 8, to avoid discharging the gaseous raw materials and the particulate foreign matter to the atmosphere, thus protecting the atmospheric environment.

For example, the air intake pipe 2 and the air pumping pipe 5 may be connected. The air outlet terminal of the air intake pipe 2 is connected to a first end of the air pumping pipe 5, a second end of the air pumping pipe 5 is connected to the negative pressure generating device 4, and the negative pressure generating device 4 is connected to the atmosphere or the dust collection box 8. The negative pressure generating device 4 applies negative air pressure to the interior of the air pumping pipe 5, such that a pressure value in the air pumping pipe 5 is less than a pressure value in the air intake pipe 2. The residual gaseous raw materials and particulate foreign matter in the air intake pipe 2 enter the air pumping pipe 5 and are discharged to the atmosphere or the dust collection box 8 through the negative pressure generating device 4, thus effectively isolating the air intake pipe 2 from the atmosphere and protecting the air intake pipe 2 from pollution.

Alternatively, for example, the air intake pipe 2 and the air pumping pipe 5 may be disposed separately. The air outlet terminal of the air intake pipe 2 is connected to the negative pressure generating device 4, the first end of the air pumping pipe 5 is connected to the negative pressure generating device 4, and the second end of the air pumping pipe 5 is connected to the atmosphere or the dust collection box 8. The negative pressure generating device 4 is used to connect the air intake pipe 2 and the air pumping pipe 5, to ensure the maximum discharge of the residual gaseous raw materials and particulate foreign matter in the air intake pipe 2, to avoid that a small amount of residual gaseous raw materials and particulate foreign matter stay in the air pumping pipe 5, and flow back to the air intake pipe 2 when the negative pressure generating device 4 stops pumping and affect the cleanliness inside the air intake pipe 2.

After the maintenance of the device portion 1 is finished, the device control portion controls the negative pressure generating device 4 to move away from the device portion 1, such that the air jet pipe 3 and the air pumping pipe 5 are connected to form the first airflow path.

In an exemplary embodiment, as shown in FIG. 6 to FIG. 8, a semiconductor manufacturing device includes a device portion 1, an air intake pipe 2, an air jet pipe 3, a negative pressure generating device 4, an air pumping pipe 5, and a device control portion. The connection relationship of the foregoing components has been described in detail in the foregoing embodiment, and is not described again herein.

In this embodiment, as shown in FIG. 7 and FIG. 8, the negative pressure generating device 4 includes a device body 41 and a driving portion 42. The device body 41 may be, for example, a housing of the negative pressure generating device 4, and is provided with an accommodating space 411 therein. A connection pipe 412 is disposed in the device body 41, the connection pipe 412 is mounted in the accommodating space 411 to shield the connection pipe 412. An air inlet terminal of the connection pipe 412 is connected to an air outlet terminal of the air intake pipe 2, and an air outlet terminal of the connection pipe 412 is connected to the air pumping pipe 5, to ensure the smoothness of the second airflow path.

The driving portion 42 is disposed in the device body 41 and mounted inside the accommodating space 411, which prevents the driving portion 42 from being exposed and protects the driving portion 42. The driving portion 42 is, for example, a micro pump unit, where a micro pump includes a pump body and a driver motor. The driving portion 42 is disposed on the path of the connection pipe 412. The driving portion 42 drives the airflow in the connection pipe 412 to flow into the air pumping pipe 5, such that an air pressure value in the connection pipe 412 is less than an air pressure value in the air intake pipe 2, to allow the residual gaseous raw materials and particulate foreign matter in the air intake pipe 2 to enter the connection pipe 412, enter the air pumping pipe 5 from the connection pipe 412, and be discharged out of the air pumping pipe 5.

For example, the driving portion 42 may be communicatively connected to the device control portion, such that the driving portion 42 can receive a control instruction from the device control portion to implement on/off of the first airflow path.

In this embodiment, as shown in FIG. 7 and FIG. 8, for example, the negative pressure generating device 4 further includes a negative pressure control portion 43 and a detection portion 44. Both the negative pressure control portion 43 and the detection portion 44 are disposed in the device body 41. The negative pressure control portion 43 may be, for example, an integrated chip, and the negative pressure control portion 43 is mounted in the accommodating space 411. The negative pressure control portion 43 is communicatively connected to the driving portion 42 and the device control portion respectively. The negative pressure control portion 43 can receive a control instruction from the device control portion, and sends a control instruction to the driving portion 42 based on the control instruction from the device control portion, such that the driving portion 42 drives the airflow in the connection pipe 412 to flow into the air pumping pipe 5.

The detection portion 44 is electrically connected to the negative pressure control portion 43. The detection portion 44 is configured to detect a state inside the air intake pipe 2. The negative pressure control portion 43 can acquire the detection result, and adjust a driving parameter of the driving portion 42 based on the detection result.

For example, the detection portion 44 includes a detector 441 and a display 442. The detector 441 and the display 442 are electrically connected to the negative pressure control portion 43 respectively. The detector 441 may be, for example, a sensor. A probe of the sensor is arranged near the air intake pipe 2, so as to detect the pressure value in the air intake pipe 2 conveniently. The display 442 may be, for example, a liquid crystal display for displaying the detection result of the detector 441 or the driving parameter of the driving portion 42. The detection result or driving parameter is intuitively presented to the operating personnel, such that the operating personnel can turn off the negative pressure generating device 4 in time in the case of an exception.

In this embodiment, as shown in FIG. 7 and FIG. 8, the negative pressure generating device 4 may further include a balancing portion 45. The balancing portion 45 is disposed at the bottom of the device body 41, and may be, for example, a counterweight block, which is used to balance the center of gravity of the negative pressure generating device 4, to prevent the device body 41 from tilting due to uneven force during operation of the negative pressure generating device 4, thereby avoiding affecting the connection effect between the air intake pipe 2 an the connection pipe 412 and the leakage between the air intake pipe 2 and the connection pipe 412.

In an exemplary embodiment, as shown in FIG. 6 and FIG. 7, a semiconductor manufacturing device includes a device portion 1, an air intake pipe 2, an air jet pipe 3, a negative pressure generating device 4, an air pumping pipe 5, and a device control portion. The connection relationship of the foregoing components has been described in detail in the foregoing embodiment, and is not described again herein.

In this embodiment, as shown in FIG. 6 and FIG. 7, the device portion 1 includes a carrier body 11 and a cover body 12. A carrying space 111 is provided in the carrier body 11. The carrying space 111 is configured to accommodate a semiconductor 6, which may be, but is not limited to, a wafer. A support 7 is placed in the carrying space 111, and the semiconductor 6 is placed on the support 7, such that a predetermined distance is kept between the semiconductor 6 and an inner bottom wall of the carrying space 111. The air intake pipe 2 is disposed in the carrier body 11 and penetrates the carrier body 11. An air inlet terminal of the air intake pipe 2 is connected to an external airflow delivery apparatus, and an air outlet terminal of the air intake pipe 2 is connected to the air jet pipe 3. The air jet pipe 3 is disposed in the cover body 12, and the cover body 12 is connected to the carrier body 11, to seal the carrying space 111. The air intake pipe 2 is connected to the carrying space 111 through the air jet pipe 3 to form the first airflow path, ensuring that the gaseous raw materials can be delivered into the carrying space 111 smoothly.

The cover body 12 is movable relative to the carrier body 11, to open or close the carrying space 111. When the carrying space 111 is open, the air outlet terminal of the air intake pipe 2 is disconnected from the air inlet terminal of the air jet pipe 3 to cut off the first airflow path. When the carrying space 111 is closed, the air outlet terminal of the air intake pipe 2 is connected to the air inlet terminal of the air jet pipe 3, to turn on the first airflow path.

In an example, the cover body 12 may form a detachable connection with the carrier body 11 magnetically. The device control portion grabs the cover body 12 with a manipulator or manually, such that the cover body 12 is separated from or assembled with the carrier body 11.

In another example, the cover body 12 may form a sliding connection with the carrier body 11. For example, a lower end surface of the cover body 12 may be provided with a slider, and an upper end surface of the carrier body 11 is provided with a sliding groove, where the slider and the sliding groove are connected in a sliding manner.

In another example, the cover body 12 may form a rotation connection with the carrier body 11. The cover body 12 is provided with a first connection lug on an outer edge, and the carrier body 11 is provided with a second connection lug on the edge. The first connection lug and the second connection lug are assembled in a staggered manner, and a shaft rod runs through the first connection lug and the second connection lug sequentially, such that the first connection lug is connected to the second connection lug in a rotatable manner through the shaft rod, to implementing flipping of the cover body 12.

In this embodiment, as shown in FIG. 6 and FIG. 7, the device portion 1 further includes a sealing structure 13. The sealing structure 13 is disposed between the cover body 12 and the carrier body 11, to seal up the gap between the cover body 12 and the carrier body 11, thus improving the airtightness of the carrying space 111.

The sealing structure 13 includes, for example, a first sealing portion 131 and a second sealing portion 132. The first sealing portion 131 may be an elastic rubber ring. The elastic rubber ring is disposed at the edge of the carrier body 11. When the cover body 12 is clamped with the carrier body 11, the rubber ring is squeezed and deformed elastically, to ensure that the cover body 12 can be smoothly assembled with the carrier body 11. After the cover body 12 is assembled, there is no external force, and the rubber ring restores the initial state under the effect of resilience, to fill the gap between the cover body 12 and the carrier body 11, ensuring the airtightness of the carrying space 111.

The second sealing portion 132 may be an elastic rubber ring, which is disposed at the air outlet terminal of the air intake pipe 2 and arranged along the circumference of the air intake pipe 2 and the air jet pipe 3, to seal up the joint between the air intake pipe 2 and the air jet pipe 3, avoiding air leakage from a seam between the air intake pipe 2 and the air jet pipe 3. Meanwhile, when the negative pressure generating device 4 is mounted in the carrier body 11, the negative pressure generating device 4 is placed on the second sealing portion 132, which can not only support the negative pressure generating device 4, and improve the airtightness of the joint between the negative pressure generating device 4 and the air intake pipe 2.

In the semiconductor manufacturing device provided by the present disclosure, movement of the negative pressure generating device is controlled based on the control instruction for the device control portion, such that the first airflow path is turned on or cut off. When the first airflow path is cut off, the negative pressure generating device is connected to the air intake pipe, to isolate the air intake pipe from the atmosphere, and preventing the residual gaseous raw materials or particulate foreign matter in the air intake pipe from reacting with molecules in the atmosphere to product unintended products to affect the cleanliness of the air intake pipe.

Moreover, the residual gaseous raw materials or particulate foreign matter in the air intake pipe is discharged by using the negative pressure generating device, which can further prevent the foreign matter from polluting the air intake pipe and prevent the foreign matter from falling into the air intake pipe.

Figure 9:
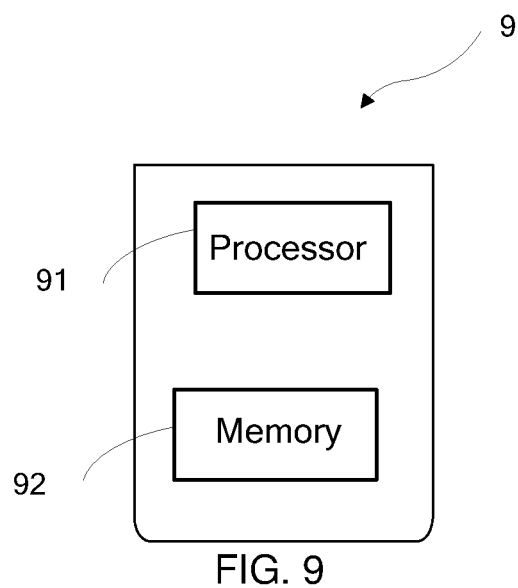
FIG. 9 is a block diagram of an apparatus of controlling a semiconductor manufacturing device according to an exemplary embodiment of the present disclosure.

FIG. 9 is a block diagram of an apparatus of controlling a semiconductor manufacturing device 9 according to an embodiment of the present disclosure. Referring to FIG. 9, the apparatus of controlling a semiconductor manufacturing device 9 includes a processor 91, and one or more processors may be provided as required. The apparatus of controlling a semiconductor manufacturing device 9 further includes a memory 92, configured to store an instruction executable by the processor 91, such as an application program. One or more memories may be set as required. The memory may store one or more application programs. The processor 91 is configured to execute the instruction to perform the above-mentioned method.

Persons skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a random access memory (RAM), a read-only memory (ROM), an electrically erasable programmable read-only memory (EEPROM), a flash memory or other storage technologies, a compact disc read-only memory (CD-ROM), a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons skilled in the art, the communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including an instruction is provided, for example, a processor 91 including an instruction, the instruction being executed by the processor 91 of the apparatus of controlling a semiconductor manufacturing device 9 to accomplish the method described above. For example, the non-transitory computer readable storage medium may be a ROM, a random access memory (RAM), a CD-ROM, a magnetic tape, a floppy disk, an optical data storage device, or the like.

A non-transitory computer-readable storage medium is provided. When instruction in the storage medium are executed by a processor of an apparatus of controlling a semiconductor manufacturing device, the apparatus of controlling a semiconductor manufacturing device is caused to perform the following steps:

receiving a control instruction, where the control instruction is used for instructing to disconnect an air outlet terminal of an air intake pipe from an air inlet terminal of an air jet pipe, to cut off a first airflow path, or connect the air outlet terminal of the air intake pipe to the air inlet terminal of the air jet pipe, to turn on the first airflow path; and driving a negative pressure generating device to be turned on and connected to the air outlet terminal of the air intake pipe or driving the negative pressure generating device to be turned on and disconnected from the air outlet terminal of the air intake pipe based on the control instruction.

The negative pressure generating device includes an air pumping pipe, and when the first airflow path is cut off, the negative pressure generating device is turned on and connected to the air outlet terminal of the air intake pipe, such that the air pumping pipe and the air intake pipe are connected and form a second airflow path.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus configured to implement a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or another programmable device, thereby generating computer-implemented processing. Therefore, the instructions executed on the computer or the another programmable device provide steps for implementing a specific function in one or more processes in the flowcharts and/or in one or more blocks in the block diagrams.

In the specification, the terms "include", "comprise", or any other variations thereof are intended to cover a non-exclusive inclusion, so that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method and the apparatus of controlling a semiconductor manufacturing device, the medium and the semiconductor manufacturing device provided by the embodiments of the present disclosure, according to the method of controlling a semiconductor manufacturing device, a control instruction is executed to implement on/off of the first airflow path, thus implementing automation of the semiconductor manufacturing device. By controlling the connection between the air pumping pipe and the air outlet terminal of the air intake pipe, water molecules and gas molecules in the atmosphere are effectively blocked to avoid the reaction between the deposited reactant inside the air intake pipe and the molecules in the atmosphere, thus avoiding producing unintended synthetics. At the same time, the negative pressure generating device is controlled to pump out the residual gaseous raw materials and particulate dust from the air intake pipe to prevent foreign matter from falling into the air intake pipe to affect the cleanliness of the air intake pipe.

The invention claimed is:

1. A method of controlling a semiconductor manufacturing device, the semiconductor manufacturing device comprising an air intake pipe and an air jet pipe, the air intake pipe and the air jet pipe being configured to be connected and form a first airflow path, and the method of controlling comprising:
   receiving a control instruction, the control instruction being used for instructing to disconnect an air outlet terminal of the air intake pipe from an air inlet terminal of the air jet pipe, to cut off the first airflow path, or connect the air outlet terminal of the air intake pipe to the air inlet terminal of the air jet pipe, to turn on the first airflow path; and
   driving an air pumping terminal of an air pumping pipe to be connected to the air outlet terminal of the air intake pipe when the control instruction instructs to cut off the first airflow path, such that the air pumping pipe and the air intake pipe are connected and form a second airflow path, and turning on a negative pressure generating device at the air pumping terminal and pumping air from the air intake pipe; or driving the air pumping terminal to be disconnected from the air outlet terminal of the air intake pipe when the control instruction instructs to turn on the first airflow path, to cut off the second airflow path, and turning off the negative pressure generating device and stopping pumping.

2. The method of controlling a semiconductor manufacturing device according to claim 1, when the driving an air pumping terminal of an air pumping pipe to be connected to the air outlet terminal of the air intake pipe, the method of controlling further comprises:
   determining a preset air pressure value of the air intake pipe;
   acquiring a current air pressure value in the air intake pipe;
   determining an air pressure difference according to the current air pressure value and the preset air pressure value; and
   determining control parameter information of the negative pressure generating device based on the air pressure difference.

3. The method of controlling a semiconductor manufacturing device according to claim 2, the determining control parameter information of the negative pressure generating device based on the air pressure difference comprising:
   acquiring configuration information, the configuration information being used for representing a correspondence between the air pressure difference and an airflow parameter, and the airflow parameter comprising an airflow rate and a duration of airflow; and
   determining a target airflow parameter based on the air pressure difference and the configuration information.

4. The method of controlling a semiconductor manufacturing device according to claim 1, further comprising:
   acquiring a current air pressure value in the air intake pipe; and
   displaying prompt information on the negative pressure generating device based on the current air pressure value.

5. The method of controlling a semiconductor manufacturing device according to claim 4,
   displaying first prompt information if the current air pressure value falls within a first preset interval; and
   displaying second prompt information if the current air pressure value falls within a second preset interval.

6. An apparatus of controlling a semiconductor manufacturing device, configured to implement the method of controlling a semiconductor manufacturing device according to claim 1, the semiconductor manufacturing device comprising an air intake pipe and an air jet pipe, the air intake pipe and the air jet pipe being configured to be connected and form a first airflow path, and the apparatus of controlling comprising:
- a processor; and
- a memory for storing an instruction executable by the processor;
- wherein the processor is configured to perform:
  - receiving a control instruction, the control instruction being used for instructing to disconnect an air outlet terminal of the air intake pipe from an air inlet terminal of the air jet pipe, to cut off the first airflow path, or connect the air outlet terminal of the air intake pipe to the air inlet terminal of the air jet pipe, to turn on the first airflow path; and
  - turning on a negative pressure generating device and connecting the negative pressure generating device to the air outlet terminal of the air intake pipe or turning off the negative pressure generating device and disconnecting the negative pressure generating device from the air outlet terminal of the air intake pipe based on the control instruction;
  - wherein the negative pressure generating device comprises an air pumping pipe, and when the first airflow path is cut off, the negative pressure generating device is turned on and connected to the air outlet terminal of the air intake pipe, such that the air pumping pipe and the air intake pipe are connected and form a second airflow path.

7. A semiconductor manufacturing device, comprising:
a device portion;
an air intake pipe, the air intake pipe being disposed in the device portion;
an air jet pipe, the air jet pipe being disposed in the device portion, the air intake pipe and the air jet pipe being configured to be connected and form a first airflow path;
a negative pressure generating device, the negative pressure generating device being detachably connected to the device portion;
an air pumping pipe, an air pumping terminal of the air pumping pipe being connected to the negative pressure generating device, and when the first airflow path is cut off, the negative pressure generating device is connected to an air outlet terminal of the air intake pipe through the air pumping pipe, such that the air pumping pipe and the air intake pipe are connected and form a second airflow path; and
a device control portion, the device control portion being electrically connected to the negative pressure generating device.

8. The semiconductor manufacturing device according to claim 7, the negative pressure generating device comprising:
a device body, a connection pipe being disposed in the device body, an air inlet terminal of the connection pipe being connected to the air outlet terminal of the air intake pipe, and the air pumping pipe being connected to an air outlet terminal of the connection pipe; and
a driving portion, the driving portion being disposed in the device body, and the driving portion being configured to drive an airflow in the connection pipe to flow into the air pumping pipe.

9. The semiconductor manufacturing device according to claim 8, the negative pressure generating device comprising:
a negative pressure control portion, the negative pressure control portion being disposed in the device body, and the negative pressure control portion being electrically connected to the device control portion and the driving portion respectively; and
a detection portion, the detection portion being disposed in the device body, and the detection portion being electrically connected to the negative pressure control portion.

10. The semiconductor manufacturing device according to claim 9, the detection portion comprising:
a detector, the detector being electrically connected to the negative pressure control portion; and
a display, the display being electrically connected to the negative pressure control portion.

11. The semiconductor manufacturing device according to claim 8, the negative pressure generating device further comprising a balancing portion, the balancing portion being disposed in the device body.

12. The semiconductor manufacturing device according to claim 7, the device portion comprising:
a carrier body, a carrying space being provided in the carrier body, the air intake pipe being disposed in the carrier body, and the carrying space being configured to accommodate a semiconductor; and
a cover body, the cover body being connected to the carrier body, the air jet pipe being disposed in the cover body, and the air intake pipe being connected to the carrying space through the air jet pipe;
wherein the cover body is movable relative to the carrier body, to open or close the carrying space;
when the carrying space is open, the air outlet terminal of the air intake pipe is disconnected from an air inlet terminal of the air jet pipe, to cut off the first airflow path; and
when the carrying space is closed, the air outlet terminal of the air intake pipe is connected to the air inlet terminal of the air jet pipe, to turn on the first airflow path.

13. The semiconductor manufacturing device according to claim 12, the device portion further comprising a sealing structure, the sealing structure being disposed between the cover body and the carrier body.

14. The semiconductor manufacturing device according to claim 7, further comprising an adjusting portion, the adjusting portion being disposed on a side of the air intake pipe away from the negative pressure generating device.

15. A non-transitory computer-readable storage medium, when an instruction in the non-transitory computer-readable storage medium is executed by a processor of an apparatus of controlling a semiconductor manufacturing device, the apparatus of controlling a semiconductor manufacturing device is caused to perform:
receiving a control instruction, the control instruction being used for instructing to disconnect an air outlet terminal of an air intake pipe from an air inlet terminal of an air jet pipe, to cut off a first airflow path, or connect the air outlet terminal of the air intake pipe to the air inlet terminal of the air jet pipe, to turn on the first airflow path; and
driving a negative pressure generating device to be turned on and connected to the air outlet terminal of the air intake pipe or driving the negative pressure generating device to be turned off and disconnected from the air outlet terminal of the air intake pipe based on the control instruction;
wherein the negative pressure generating device comprises an air pumping pipe, and when the first airflow path is cut off, the negative pressure generating device is turned on and connected to the air outlet terminal of the air intake pipe, such that the air pumping pipe and the air intake pipe are connected and form a second airflow path.

* * * * *